United States Patent [19]

Richardson et al.

[11] Patent Number: 4,733,165
[45] Date of Patent: Mar. 22, 1988

[54] MULTIMODE RESONANCE CHAMBER AND METHOD OF DETERMINING AN EQUIVALENT SINGLE MODE RELAXATION RESPONSE

[75] Inventors: Robert E. Richardson, King George; Reginald I. Gray, Fredericksburg, both of Va.

[73] Assignee: The United States of America as represented by the Secretary of the Navy, Washington, D.C.

[21] Appl. No.: 838,073

[22] Filed: Mar. 10, 1986

[51] Int. Cl.[4] ............................................. G01R 27/26
[52] U.S. Cl. .......................... 324/58.5 C; 324/58.5 R
[58] Field of Search ...................... 324/58.5 C, 58.5 R, 324/316, 317, 58 C; 364/575, 734

[56] References Cited

U.S. PATENT DOCUMENTS

| | | | |
|---|---|---|---|
| 2,520,602 | 4/1947 | Linder | 324/58.5 C |
| 3,581,190 | 5/1971 | Brown | 324/58.5 C |
| 3,946,308 | 3/1976 | Miura et al. | 325/58.5 C |
| 4,277,741 | 7/1981 | Faxvog et al. | 324/58.5 C |

OTHER PUBLICATIONS

American Institute of Electrical Engineers, R. W. Lange, Measurement of High Q Cavities at 10,000 Megacycles, Dec. 1946.

Primary Examiner—Reinhard J. Eisenzopf
Assistant Examiner—Anthony L. Miele
Attorney, Agent, or Firm—Elmer E. Goshorn; William C. Townsend

[57] ABSTRACT

An improved microwave pulsed and computer-operated resonance chamber system for obtaining various parameters for a multimode chamber with or without a specimen therein. The system is generally made up of a continuous microwave signal source arrangement for transmitting a series of pulses to the interior of the chamber at one point thereof. A detector for sensing a transient relaxation response curve after each pulse in the chamber where the sensing is effected at a second point in the chamber and where the curve is representative of the relative field strength in the chamber. In one embodiment of the system the carrier frequency of the series of pulses is selectively adjusted so as to alter the multimode characteristics of the chamber in order to provide different transient relaxation response curves by the chamber. In a second and third embodiment of the system, selective rotatable tuning means is provided at a third relatively spaced point in the chamber for altering the mode characteristics thereof. Regardless of the embodiment of the system, analyzer means and a computer arrangement is provided for advantageously determining a series of ensemble averaged mean squared voltage values in relation to time from selected groups of digitized and squared data points where the data points stem from a series of analyzed response curves and where the determined values enable the determination of various parameters of the multimode chamber, namely the equivalent single mode response and its calibration factor with or without a specimen therein.

25 Claims, 4 Drawing Figures

TIME (NANOSECONDS)

MULTIMODE RESONANCE CHAMBER AND METHOD OF DETERMINING AN EQUIVALENT SINGLE MODE RELAXATION RESPONSE

This invention relates to a microwave pulsed resonance chamber system; and, more particularly, it relates to an improved computer-operated and microwave-pulsed resonance chamber system for obtaining various parameters with or without a specimen in the chamber thereof.

BACKGROUND OF THE INVENTION

Various types of resonator chambers or resonance systems have been developed in the past for the purpose of obtaining certain results. For example, U.S. Pat. No. 2,520,602 to Linder discloses a resonator chamber having rapidly variable moding characteristics therein. The species of FIG. 2 is considered pertinent and is generally made up of a resonator cavity, a microwave source, a pair of continuously rotatable conductive vanes at a desired frequency and a detector device for sensing the cavity response. By virtue of the detector having a long time constant and by reason of the rotation of the vanes modifying the chamber electric fields at a rate faster than the detector time constant, the detector provides an analog value which is characteristic of the average microwave energy transfer of the resonator. U.S. Pat. No. 3,581,190 to Brown relates to a microwave resonance system having a bimodal cavity arrangement. The system is generally made up of separate microwave sources, an input/output wave guide, a detector, a resonance chamber of fixed configuration, and a tandem chamber of adjustable configuration for tuning purposes. A specimen is located in the fixed chamber and interacts with the simultaneous resonant frequencies of both sources when the adjustable chamber is properly tuned in relation to a wave source. In an operative embodiment one of the wave sources can be pulse operated rather than a continuous wave. U.S. Pat. No. 3,946,308 to Miura et al. discloses a resonance chamber system for measuring relative humidity of a given air sample. The system is generally made up of an open-ended cylindrical shield, separate input/output antennas and a solid dielectric core element. The antennas are connected to the shield in longitudinally aligned and diametrically opposed relationship to each other with the core element interposed therebetween. A swept-frequency oscillator is connected to the input antenna. The output antenna together with its output source transforms the received signal transmitted by the input antenna into a calibrated display that directly indicates the relative density for the air sample enveloped by the shield during system use. U.S. Pat. No. 4,277,741 to Faxvog et al. concerns a microwave acoustic spectrometer for measuring the microwave absorbing characteristics of both dielectric and metal samples. The spectrometer is generally made up of a sealed cavity for receiving a sample. A coaxial conductor transmits a modulated microwave signal at a reference frequency into the cavity. The microphone responds to the heated atmosphere of the cavity as the result of the signal being absorbed by the specimen and provides an output that is transformed into an absorption parameter of the sample at the reference frequency. However, none of the afore-discussed references whether taken alone or in any combination remotely suggest an improved computer-operated and microwave pulsed resonance chamber system for obtaining various parameters in relation to the multimode chamber thereof. The computer-operated system in any embodiment thereof is provided with a detection sample analyzer for initially obtaining a series of data points in relation to time for each transient relaxation response curve after each pulse excitation and selectively tuned condition of the chamber or after each pulse excitation at a particular carrier frequency to alter the multimode characteristics of the chamber. The computer arrangement of the system functions to advantageously determine the ensemble averaged mean squared voltage value from more than one group of selected digitized and squared data points that stem from the analyzed series of data points of more than one response curve. Graphical plotting of the ensemble averaged values in relation to time enables the determination of various parameters such as the equivalent single mode relaxation response time for the multimode chamber as well as the chamber calibration factor (with or without a specimen therein).

SUMMARY OF THE INVENTION

An object of the invention is to provide an improved computer-operated and microwave-pulsed resonance chamber system for measuring the relative field strength of the multimode chamber at one point thereof so as to ultimately obtain the equivalent single mode relaxation response time of the chamber.

Another object of the invention is to provide an improved computer-operated and microwave-pulsed resonance chamber system that provides a continuously operable and reliable system in obtaining various parameters of the multimode chamber with or without a specimen therein.

Still another object of the invention is to provide an improved computer-operated and microwave-pulsed resonance chamber system that provides a graphical display of the equivalent single mode relaxation response curve in relation to time of the multimode chamber where such curve enables the determination of both the chamber relaxation time and its calibration factor.

In summary, the invention concerns an improved computer-operated and microwave-pulsed, resonance chamber system having a multimode chamber. The system is provided with antenna means at one point of the chamber interior for transmitting a series of pulses therein so as to cause serial excitation of the chamber. Detection means of the system is provided at a second point in the chamber interior that is spaced from the first point for sensing each transient relaxation response curve after each pulse excitation of the chamber.

In one embodiment of the system, selectively adjustable oscillator means are provided in the microwave source means for controlling the carrier frequency of each pulse transmitted into the chamber interior. By varying the carrier frequency for the series of pulses transmitted into the chamber, the multimode characteristics of the chamber are changed for each pulse frequency; and thus, a different transient relaxation response curve is provided after each pulse excitation of the chamber and at a different carrier frequency than any prior pulse excitation thereof.

In two other embodiments of the system, selectively rotatable tuning means is connected to the chamber and inserted in the chamber interior at a third point spaced from the first and second points for selectively controlling the tuning conditions of the chamber interior for each indexed portion of the tuning means. The tuning means is advantageously comprised of a plurality of radially extending vanes of different configuration. Further, the plurality of vanes of different configuration are randomly arranged about the axis of the tuning means. Hence, by selectively adjusting the tuning means a different set of multimode characteristics is provided for the chamber; and thus, the detection means detects different transient relaxation response curves for each tuned chamber condition and after each pulse excitation of the chamber.

The system is provided with analyzer means for analyzing each response curve as detected by the detection means so as to provide a series of data points in relation to time. In certain embodiments of the system, the analyzing means further functions to square the value of each data point of any series of data points as well as preferably transform the squared value of each data point into digital form. A computer arrangement of the system advantageously functions to determine the ensemble averaged mean squared voltage values in relation to time of a plurality of groups of selected squared data points in digital form of analyzed response curves. Each ensemble averaged mean squared voltage value in being determined from its associated group of selected points occurs at a selected time delay of a plurality of time delays where the selected time delay for the ensemble averaged value corresponds to the same time delay at which each data point of the associated group of data points of analyzed response curves occurs. As the result of determining a plurality of ensemble averaged values at more than one time delay, it has been found that a novel exponential curve is formed from which chamber parameters, namely, the equivalent single mode relaxation response time and the chamber calibration factor are readily determined. If the chamber is used with a specimen, an effective power density surrounding the specimen can be readily determined.

The ensemble averaged mean squared voltage value as used throughout the specification and claims is defined as that value made up from its associated group of selected and squared data points in digital form of analyzed response curves at a selected time delay of a plurality of time delays where the selected time delay for the ensemble averaged value is the same time delay at which each data point of the group of selected data points of analyzed curves occurs.

Other objects and advantages of the invention will become apparent when taken in conjunction with the appended drawings and specification.

DETAILED DESCRIPTION OF THE INVENTION

Figure 1:
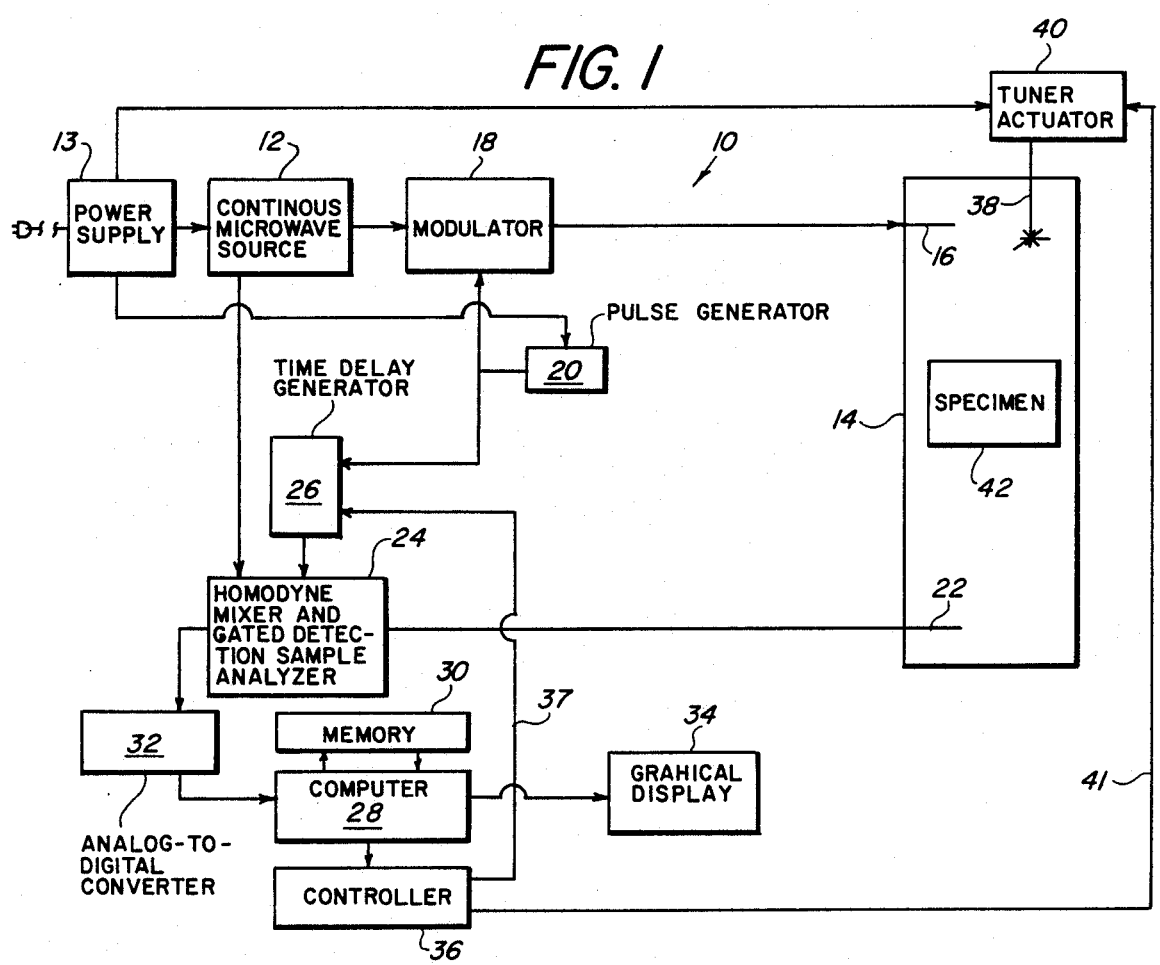
FIG. 1 is a schematic of an embodiment of an improved computer-operated and microwave pulsed resonance chamber system for evaluating the chamber with a specimen therein.

With further reference to FIG. 1, an improved computer-operated and microwave-pulsed resonance chamber system 10 is generally made up of a continuous microwave signal source 12 and a multimode, selectively tunable chamber 14. It is noted here that chamber 14 is of suitable construction so that the chamber interior is shielded from the surrounding environment where system 10 is used. The interior wall liner of chamber 14 can be any suitable ferrous or nonferrous material such as, e.g., iron, copper or aluminum. A power supply 13 energizes source 12 during system use. A pulse transmitting antenna 16 is connected to chamber 14 and inserted at a point in the interior thereof. A modulator 18 is interposed between and connected to antenna 16 and source 12. A pulse generator 20 is also connected to supply 13.

Detection means 22 such as a suitable transient-response receiving antenna is connected to chamber 14 and inserted into the chamber interior at another point relatively spaced from antenna 16 and its insertion point into the chamber interior. Homodyne mixer and gated detection sample analyzer 24 is interposed between and connected to another output of source 12 and the output of detection means 22. An output of time delay generator 26 is connected to mixer and analyzer 24. An output of pulse generator 20 is parallel connected to modulator 18 and generator 26.

A computer 28 having a memory 30 is connected to an output of mixer and analyzer 24. An analog-to-digital converter 32 is series connected to the output between mixer and analyzer 24 and computer 28. The computer is provided with separate outputs for a graphical display 34 and a controller 36. An output 37 of controller 36 is connected to generator 26.

A selectively rotatable tuning element 38 is connected to chamber 14 and inserted at a third point in the chamber interior that is relatively spaced from both antenna 16 and detection means 22 at their inserted first and second relatively spaced points. Element 38 is preferably of paddle-wheel-like configuration and is generally made up of a series of randomly spaced and differently configured radial vanes selectively arranged about the rotary axis of element 38 as shown in FIG. 1. As will become more apparent hereinafter, one of the advantages of element 38 in being made up of a plurality of randomly arranged radial vanes of different configuration is that it assures chamber 14 will have a different set of multimode characteristics for each tuned condition of the chamber during use of system 10. A tuning actuator 40 is interposed between and interconnected to supply 13 and another output 41 of controller 36.

Figure 2:
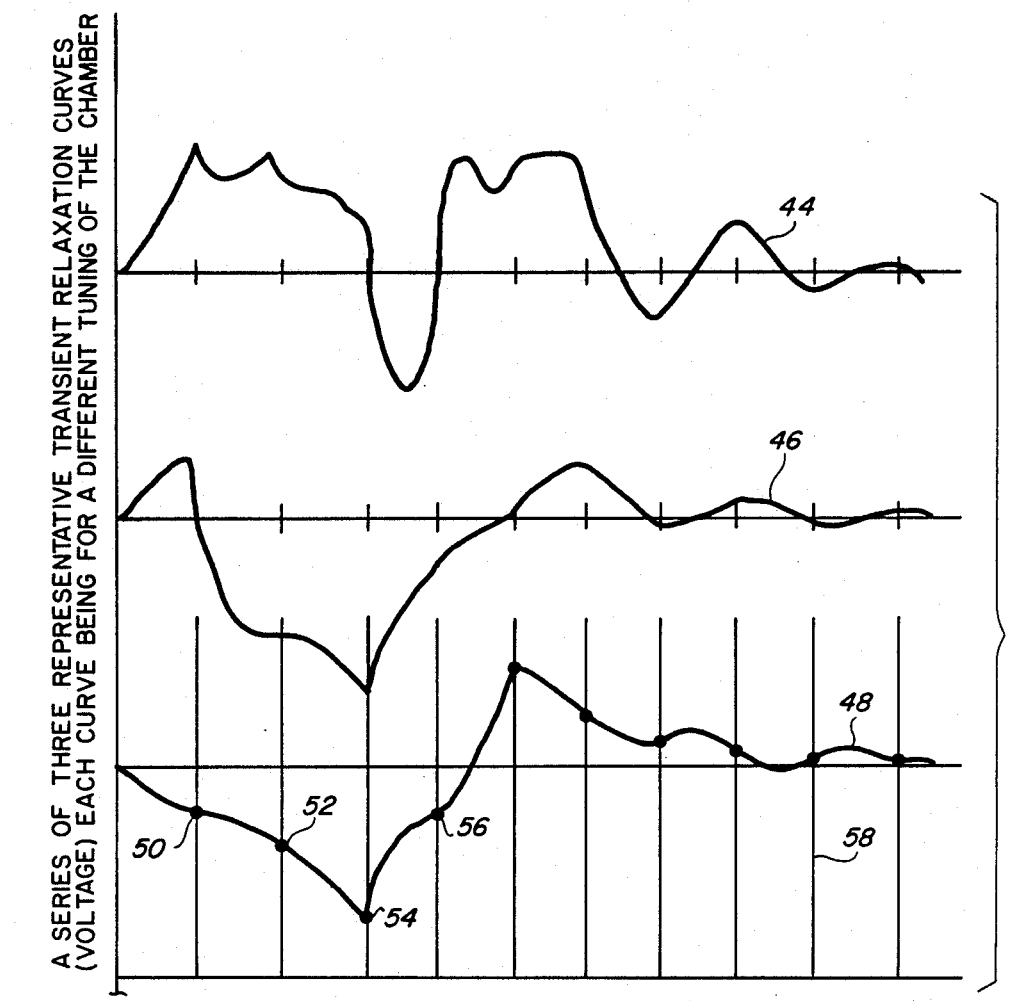
FIG. 2 is a graphical view of a series of three sample transient relaxation response curves in relation to time where each sample curve illustrates the transient response for a different tuned condition of the chamber.

In an operative embodiment of system 10, a specimen 42 is inserted in the chamber interior in spaced relation to antenna 16, detection means 22 and tuning element 38 as shown in FIG. 1. Pulse generator 20 transmits a series of pulses to microwave pulses so to cause the modulator to transmit a series of microwave pulses to antenna 16 for causing continuous pulses excitation of the chamber interior during system use. Detection means 22 senses the relative field strength between successive pulses of the series of pulses. Each sensed relative field strength is representable by a transient relaxation response curve. A series of three transient relaxation response curves 44, 46 and 48 in terms of voltage in relation to time are depicted in FIG. 2. Each curve 44, 46 or 48 is of different shape because it represents a different tuned condition of chamber 14. As each sensed curve is received by mixer and analyzer 24 it is combined with the reference signal from source 12 so as to be in analyzable form such as indicated by curve 44, 46 or 48.

Detection sample analyzer of mixer and analyzer 24 functions to analyze a transient relaxation response curve in relation to time for each tuned condition of chamber 14. To this end, when generator 20 sends a pulse output to modulator 18 for transmitting a pulse to antenna 16, its parallel output also transmits a pulse to generator 26. As result of the pulse to generator 26, its output to analyzer 24 causes analysis of response curve 48 in relation to time, e.g., at time, $t_o$, and determines data point 50. Data point 50 is converted to digital form by converter 32. At the same time, the digital value of data point 50 is stored by memory 30 of computer 28. Feedback 37 of controller 36 as result of the digitized value of data point 50 directs an output to generator 26. Then generator 26 functions to direct another output to analyzer 24 to determine data point 52 of curve 48 at the next time delay, $t_i$. Hence, generator 26, analyzer 24, converter 32, computer 28 and controller 36 advantageously coordinate to cause analysis of each response curve for a tuned chamber condition in relation to time so as to determine a series of data points such as the series of points 50, 52, 54, 56, etc. in relation to a plurality of time delays for curve 48 until curve 48 sufficiently approaches or reaches its zero value. For the sake of simplicity, the series of analyzed data points in relation to time for curves 44 and 46 as effected by the analyzer of element 24 is not shown in FIG. 2.

As further evident in FIG. 2, the series of data points 50, 52, 54, 56, etc. occur at equal time intervals caused by the output of generator 26 during system use and as represented by the series of laterally spaced parallel lines 58. Further, the series of time delays as represented by the series of lines 58 can be mathematically expressed by the formula: $t_i = t_o + k\Delta t$ where $t_i$ is for any time delay; $t_o$ is the initial time delay; $\Delta t$ is the time interval between successive delays; and corresponds to a number relating to the time delay in question such as the sixth (6th) time delay ($t_6$) after $t_o$.

When a series of data points in digital form for a curve, such as curve 48, have been stored in memory 30, controller output 41 causes tuning actuator 40 to index element 38 to its next indexed position for tuning chamber 14 to a different set of multimode characteristics prior to the next pulse excitation of chamber 14 by antenna 16. In order to determine a satisfactory equivalent single mode relaxation response for chamber 14 with or without a specimen 42 therein, it has been found that element 38 should be indexed from about fifty to four hundred (50 to 400) different positions about its rotary axis. Thus, at least fifty response curves as analyzed by analyzer 24 and stored as a set of fifty different series of data points in digital form in memory 30 can be sufficient in determining an equivalent single mode relaxation response curve for chamber 14 as will now be described.

Figure 3:
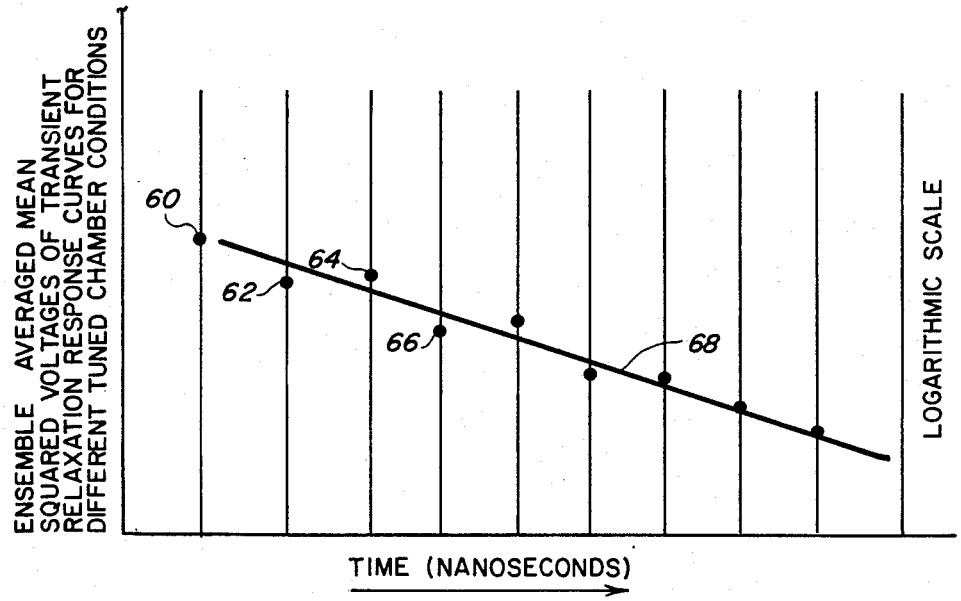
FIG. 3 is another graphical view of a curve of an ensemble average of a series of transient response curves for different tuned conditions of the chamber in relation to time where the curve assists in determining the equivalent single mode relaxation response for the multimode chamber of the improved system of the invention.

The stored set of data points are then further analyzed by computer 28 by each data point of the set being squared. Then a series of ensemble averaged mean squared voltage values of a plurality of groups of squared data points in relation to time is advantageously determined by computer 28. To this end, each group of the plurality relates to a selected series of data points at a selected and common time delay. Further, each one of the data points of the series of data points of a group at a common time delay stems from its associated transient relaxation response curve. Hence, the computer in determining a series of ensemble averaged mean squared voltage values of a plurality of groups of stored data points in relation to time determines a series of ensemble averaged mean squared voltage values such as the series of values 60, 62, 64, 66, etc. in relation to their associated time delays of the plurality of time delays as represented by spaced lines 58 in the manner depicted in FIG. 3.

It has been found in accordance with the teachings of the invention that a series of ensemble averaged mean squared transient response values of a mode-stirred, multimode chamber is exponential with respect to time. By reason of this exponential relationship, a series of ensemble averaged mean squared transient response values is advantageously expressed by the invention in the form of a series of analyzed values or data points 60, 62, 64, 66, etc. as aforedescribed in relation to time where such series of analyzed data points can be fitted to a curve, such as curve 68 in FIG. 3. Further, the curve is mathematically expressed by the formula: $N = N_o e^{-t_i/\tau}$ where N is the chamber ensemble averaged transient relaxation response at a given sensed point of the chamber at any time, $t_i$; $N_o$ is the chamber transient relaxation response at the given sensed point of chamber 14 when i is zero. e is a commonly known constant value of 2.71+. $t_i$ is any particular time delay; and $\tau$ is the equivalent single mode relaxation response time for multimode chamber 14. It is to be understood that $\tau$ can be determined in various ways, such as, e.g., by least square analysis on a computer or by graphically plotting a series of data points of ensembled averaged mean squared values (logarithmic scale) in relation to time as shown by curve 68 in FIG. 3 and as effected by display 34 of FIG. 1 or by any suitable means. It is noted here that curve 68 was obtained with chamber 14 having specimen 42 therein. Since most specimens analyzed by system 10 have absorption or lossy characteristics, a transient relaxation response curve for chamber 14 without a specimen 42 would normally have longer $\tau$ values.

Since $\tau$ is a function of an equivalent single mode chamber, the calibration factor for chamber 14 with or without a specimen therein can be readily determined from the mathematical formula: $M = c\tau/V$ where "C" is the speed of light; and "V" is the chamber interior volume. Then the effective power density of $<PD_{eff}>$ in the chamber per unit of net input power can be determined from the formula: $<PD_{eff}> = MP_I$ where $P_I$ is the net input power transmitted into the chamber interior during system use. $<PD_{eff}>$ is in effect the spatial average of the effective power density for chamber 14.

Figure 4:
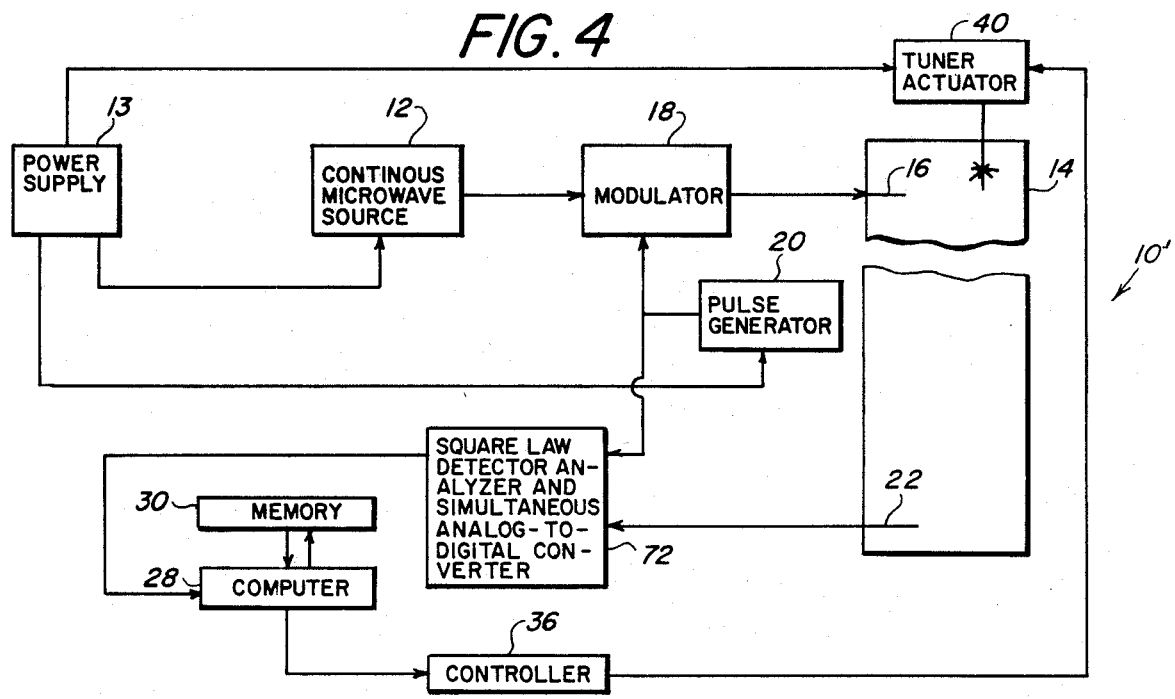
FIG. 4 is a schematic view with parts removed and other parts broken away of another embodiment of the invention.

In another advantageous embodiment of the invention and as shown in FIG. 4, system 10' is generally comprised of a combined arrangement of square law detection sample analyzer and simultaneous analog-to-digital converter 72. The analyzer can be provided with power meter means which is connected to the output of detection means 22. It is noted here that elements in FIG. 1 correspond to like elements. Arrangement 72 functions to analyze each detected transient relaxation response curve for each tuned condition of chamber 14 by providing a series of data points in relation to time as representative of its associated curve, immediately squaring each data point upon detecting and analyzing each curve, and then converting each squared data point into digital form. Parallel output of generator 20 to arrangement 72 indicates when the next detected response curve is to be analyzed. As computer 28 receives a series of digitized data points from arrangement 72 as representative of one detected response curve, controller 36 transmits an ouput to actuator 40 for indexing element 38 to another position to alter chamber 14 to another set of multimode characteristics during system use. When memory 30 stores a sufficient set of more than one series of data points for more than one analyzed curve, computer functions to determine a series of ensemble averaged means squared voltage values of more than one group of selected series of data points in relation to time so as to determine an equivalent single mode relaxation response curve, such as curve 68 depicted in FIG. 3.

Figure 5:
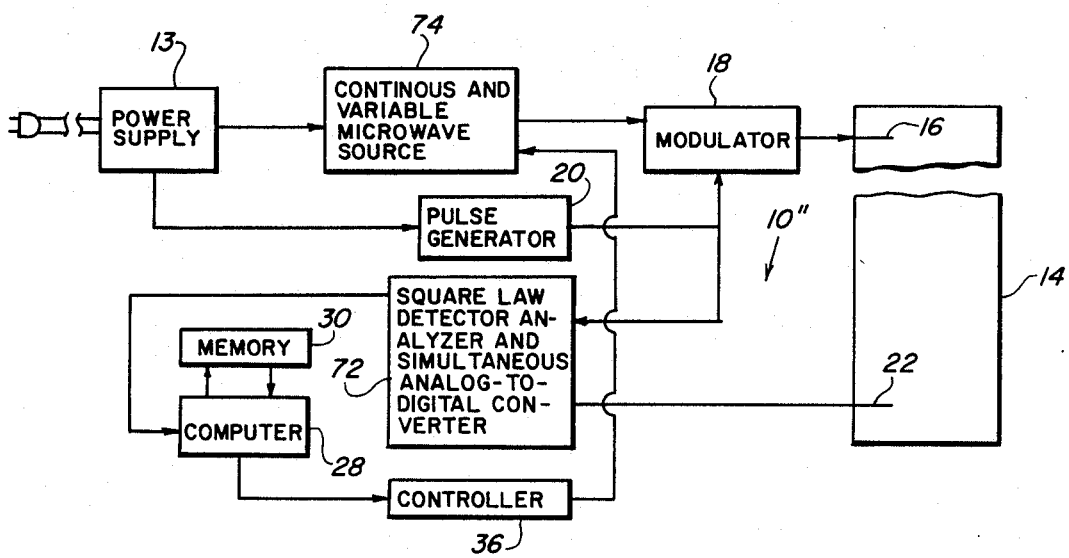
FIG. 5 is a schematic view of still another embodiment of an improved computer-operated and microwave-pulsed resonance chamber system.

In another embodiment as depicted in FIG. 5, system 10" is generally comprised of a continuous and variable microwave source 74 which is provided with a suitable adjustable oscillator. In this instance, chamber 14 is not provided with tuning element 38. When computer 28 receives a series of digitized and squared data points as representative of an analyzed transient relaxation response curve, output 76 of controller is connected to the oscillator of source 74 to change the carrier frequency thereof. Hence, by each change in the pulse carrier frequency, chamber 14 is provided with a different set of multimode characteristics. As with the prior embodiments 10 and 10' of the system, when computer 28 of the system 10" receives a sufficient set of more than one series of stored data points of different analyzed transient relaxation response curves sensed at element 22, computer functions to determine a series of ensemble averaged mean squared voltage values so as to form an equivalent single mode relaxation response curve, such as curve 68 in FIG. 3.

In view of the foregoing it is evident in any embodiment of the invention that it provides continuous and relatively rapid uninterrupted analysis for determining the equivalent single mode relaxation response for a mode-stirred, multimode chamber. As result of this improved analysis by the inventive embodiments, adjustments can be readily made to system 10, 10' or 10" to assure proper analysis of chamber 14 with or without a speciment 42. Adjustments to the system could be, e.g., increased power input to the chamber, alter the characteristics of the internal walls or contents of the chamber or change the geometrical configuration of the chamber.

Obviously, many modifications and variations of the present invention are possible in light of the above teachings. It is therefore to be understood that, within the scope of the appended claims, the invention may be practiced otherwise than as specifically described.

What is claimed is:

1. A resonance system comprising:
    multimode chamber means having wall means for shielding the interior of the chamber means from the surrounding environment,
    transmitting antenna means connected to the chamber means and inserted in the chamber means interior at a given point for continuously transmitting a series of microwave pulses therein so as to excite the interior thereof,
    power supply means and continuous microwave source means connected to the power supply means, a pulse output of said microwave source means being connected to the antenna means, said microwave source means being comprised of adjustable oscillator means for controlling the carrier frequency of a pulse transmitted to the antenna means,
    detection means connected to the chamber means and inserted in the chamber means interior at a second point relatively spaced from the antenna means, said detection means for sensing at the second point in terms of voltage a transient relaxation response curve of the relative field strength in the chamber means interior thereat for each pulse transmitted by the antenna means,
    analyzer means separately connected to the detection means for simultaneously analyzing and converting each detected response curve into a series of digitized data points in relation to a series of selected time delays after each pulse excitation of the chamber means interior, where each detected response curve is analyzed by selecting a series of data points with each data point being for a time delay of the series of selected time delays and then converting each analyzed data point into a squared voltage value prior to digitizing the squared voltage value of each selected data point of an analyzed response curve,
    computer means connected to the digital output of the analyzer means for storing a set of digitized data where the stored set relates to more than one series of digitized data points for more than one analyzed response curve of the chamber means, and
    controller means interposed between and connected to the computer means and the oscillator means, said controller means for causing the oscillator means to adjust its frequency after each series of digitized data points for a response curve is stored in the computer means in order to cause said microwave source means to provide a different carrier frequency for transmitting a pulse to the chamber means interior for the purpose of generating a different transient relaxation response curve to be detected by said detection means,
    said computer means for also determining a group of data points in relation to time where each data point of the group is an ensemble averaged mean squared voltage of a plurality of selected digitized data points of the stored set at a common time delay for each selected data point of the plurality with each common time delay being a given time delay of the series of selected time delays, said computer means for then graphically plotting the ensemble averaged mean squared voltage values of the group of data points (logarithmic scale) in relation to time so as to form a curve from which the equivalent single mode relaxation response for the multimode chamber means of the system is determined.

2. A system as set forth in claim 1 wherein the chamber means has a specimen therein.

3. A system as set forth in claim 1 wherein the microwave source means is also comprised of modulator means and pulse generator means, wherein the source means and the modulator means are series interconnected to the transmitting antenna means, and wherein the pulse generator means output is parallel connected to both the analyzer means and the modulator means.

4. A resonance system comprising:
multimode chamber means having wall means for shielding the interior of the chamber means from the surrounding environment,
transmitting antenna means connected to the chamber means and inserted in the chamber means interior at a given point,
power supply means and continuous microwave source means connected to the power supply means,
said microwave source means including means for continuously transmitting a series of pulses to the transmitting antenna means for exciting the chamber means during system use,
tuning means connected to the chamber means and inserted in the chamber means interior at a second point relatively spaced from the antenna means, said tuning means being selectively indexable from one position to another so as to selectively alter the multimode characteristics of the chamber means interior for each indexed position thereof,
detection means connected to the chamber means and inserted in the chamber means interior at a third point relatively spaced from the antenna means and the tuning means, said detection means for sensing at the third point a transient relaxation response curve of the relative field strength in the chamber thereat after each pulse excitation of the chamber and for each selectively tuned condition of the chamber means by said tuning means,
analyzer means connected to the detection means for simultaneously analyzing and converting each detected response curve into a series of data points in terms of squared voltages in relation to a series of preselected time delays, and then converting each data point of the series of data points for each detected response curve into digital form, and
computer means connected to the digitized output of the analyzer for storing a set of digitized data points where the set corresponds to more than one series of digitized data points and where each series of digitized data points relates to its associated and analyzed response curve, said computer means for determining a group of data points in relation to time where each data point of the group is an ensemble averaged mean squared voltage value of a plurality of selected digitized data points of the stored set at a common time delay for each selected data point of the plurality with the common time delay for any data point of the group and the plurality of selected data points directly associated with any point thereof being a selected time delay of the series of selected time delays, said computer means for graphically plotting the ensemble averaged mean squared voltage values of the group of data points (logarithmic scale) in relation to time so as to form a curve from which an equivalent single mode relaxation response for the multimode chamber means of the system is determined.

5. A system as set forth in claim 4 wherein the chamber means has a specimen therein.

6. A system as set forth in claim 4 wherein the detection means is comprised of antenna means.

7. A system as set forth in claim 4 wherein the computer arrangement is comprised of controller means, wherein said controller means is connected to said tuning means for controlling the indexing thereof after each series of digitized data points for a given response curve sensed by said detection means is stored in the computer arrangement.

8. A system as set forth in claim 4 wherein the microwave source means is comprised of a continuous microwave source, modulator means and pulse generator means, wherein the source and modulator means are series interconnected to the transmitting antenna means and wherein an output of the pulse generator means is parallel connected to both the modulator means and the analyzer means.

9. A system as set forth in claim 4 wherein the tuning means is comprised of paddle-wheel-like means, and wherein the paddle-wheel-like means is made up of a series of radial extending vanes of different configurations with the series of vanes being randomly arranged about the axis of the tuning means.

10. A resonance system comprising:
multimode chamber means having wall means for shielding the interior of the chamber means from the surrounding environment;
transmitting antenna means connected to the chamber means and inserted in the chamber means interior at a given point for continuously transmitting a series of microwave pulses therein so as to excite the interior thereof;
power supply means and continuous microwave source means interposed between and connected to the power supply means and the transmitting antenna means,
tuning means connected to the chamber means and inserted in the chamber means interior at a second point relatively spaced from the antenna means, said tuning means being selectively indexable from one position to another so as to selectively alter multimode characteristics of the chamber means interior for each indexed position thereof,
detection means connected to the chamber means and inserted in the chamber means interior at a third point relatively spaced from the antenna means and the tuning means, said detection means for sensing at the third point in terms of voltage a transient relaxation response curve of relative field strength in the chamber means thereat for each selectively tuned condition of the chamber means by said tuning means,
mixer and sample analyzer means separately connected to another output of the continuous microwave source means and to the detection means for simultaneously analyzing and converting each detected response curve for each tuned condition of the chamber means where each curve is analyzed by selecting a series of data points in relation to a series of selected time delays and then by converting each analyzed data point at a given time delay of the series into digital form, and
computer means connected to the digital output of the mixer and analyzer means for storing a set of digitized data where the set relates to more than one series of digitized data points with each series being for an analyzed response curve at a selected tuned condition of the chamber means, said computer means for converting each data point of each series of digitized data points of the stored set into terms of squared voltage and then for determining a group of data points in relation to time where each data point of the group is an ensemble averaged mean squared voltage value of a plurality of selected digitized data points of the stored set at a common time delay for each selected data point of the plurality with the common time delay for any data point of the group and the plurality of selected data points directly associated with any point thereof being a selected delay of the selected series of time delays, said computer means for graphically plotting the ensembled averaged means squared voltage values of the group of data points (logarithmic scale) in relation to time so as to form a curve from which the equivalent single mode relaxation response for the multimode chamber means of the system is determined.

11. A system as set forth in claim 10 wherein said source means is comprised of modulator means, and wherein the source means and modulator means are series interconnected to the transmitting antenna means.

12. A system as set forth in claim 10 wherein said mixer and analyzer means is provided with time delay generator means.

13. A system as set forth in claim 10 wherein said source means is comprised of modulator means and pulse generator means, wherein the source means and modulator means are series interconnected to the transmitting antenna means, and wherein the pulse generator means is parallel connected to the modulator means and the mixer and analyzer means.

14. A system as set forth in claim 10 wherein the tuning means is comprised of paddle-wheel-like means, the paddle-wheel-like means being made up of a series of radial extending vanes of different configurations where the series of vanes are randomly arranged about the axis of the tuning means.

15. A method for determining the equivalent single mode relaxation response of a pulse-operated, multimode resonance chamber, said method comprising the steps of:

transmitting a continuous series of microwave pulses into the interior of a resonance chamber at a first point thereof so as to excite the interior to form a plurality of random relative electromagnetic fields within the interior, selectively adjusting the carrier frequency of one or more pulses of the series of transmitted pulses so as to alter the mode response characteristics of the chamber in relation to each pulse at a given selected carrier frequency, sensing a plurality of transient relaxation response curves in terms of voltage where each curve is representative of the relative field strength of the chamber after each pulse excitation thereof at a selected frequency and where the sensing is effected at a second point in the chamber interior spaced from the first point thereof, analyzing more than one sensed transient response curve where each curve is analyzed at each time delay of a plurality of selected time delays so as to provide more than one series of data points in relation to the plurality of time delays with each series of data points being representative of a response curve after pulse excitation of the chamber at a given carrier frequency, squaring each data point of each series of data points, converting each squared data point of each series of data points into digital form, determining a group of ensemble averaged mean squared voltage values at the plurality of selected time delays where each ensemble averaged mean squared voltage value of the group is determined from a plurality of squared and digitized data points that stem from selected data points of more than one series of data points of analyzed response curves at a common time delay with the common time delay being one of the time delays of the plurality of selected time delays, and graphically plotting the group of ensemble averaged mean squared voltage values (logarithmic scale) in relation to time so as to form a curve from which an equivalent single mode relaxation response is determined for a multimode chamber.

16. A method as set forth in claim 15 wherein the chamber has a specimen therein.

17. A method as set forth in claim 15 wherein the step of selectively adjusting the frequency of one or more pulses of the series of pulses is effected by adjustable oscillator means and controller means operatively associated with the oscillator means.

18. A method as set forth in claim 15 wherein the steps of analyzing, squaring and converting is effected by square law detection sample analyzer and simultaneous analog-to-digital converter means.

19. A method as set forth in claim 15 wherein the steps of determining and plotting is effected by computer means.

20. A method for determining the equivalent single mode relaxation response of a pulse-operated, multimode resonance chamber, said method comprising the steps of:

transmitting a continuous series of microwave pulses into the interior of said resonance chamber at a first point in the interior thereof so as to excite the interior to form a plurality of random relative electromagnetic fields within the interior, selectively tuning the chamber from one tuned condition to another so as to provide a different set of multimode characteristics of the chamber in relation to at least one pulse being transmitted into the chamber for each different tuned condition of the chamber, sensing a plurality of transient relaxation response curves in terms of voltage that are representative of relative field strengths for selected and different tuned conditions of the chamber where the sensing is effected at a second point in the chamber interior spaced from the first point thereof, and where each curve of the plurality is sensed between successive pulses for excitation of the chamber, analyzing more than one sensed transient response curve where each curve is analyzed at each time delay of a plurality of selected time delays so as to provide more than one series of data points in relation to the plurality of time delays with each series of data points being representative of a response curve for a selected tuned condition of the chamber, converting each data point of a series of data points of each response curve into digital form, further analyzing a set of data points where the set is made up of more than one series of data points of a plurality of analyzed response curves by squaring each data point of the set, determining a group of ensemble averaged mean squared voltage values at the plurality of selected time delays where each ensemble averaged mean squared voltage value of the group is determined from a selected plurality of squared data points of the set that stem from selected data points of more than one series of data points of the set at a common time delay with the common time delay being one of the time delays of the plurality of selected time delays, and graphically plotting the group of ensemble averaged mean squared voltage values (logarithmic scale) in relation to time so as to form a curve from which an equivalent single mode relaxation response is determined for a multimode selectively tuned chamber.

21. A method as set forth in claim 20 wherein the step of tuning is effected by rotatable means of paddle-wheel-like configuration having a series of radially extending and randomly arranged vanes of different configurations disposed about the axis of the rotatable means, and wherein the rotatable means is located in the chamber at a third point therein relatively spaced from the first and second points.

22. A method as set forth in claim 20 wherein the steps of transmitting and sensing is effected by separate antenna means.

23. A method as set forth in claim 20 wherein the step of analyzing is effected by a homodyne mixer and gated detection sample analyzer means.

24. A method as set forth in claim 20 wherein the series of steps of analyzing, converting and further analyzing is effected by square law detection sample analyzer and simultaneous analog-to-digital converter means.

25. A method as set forth in claim 20 wherein the chamber has a specimen therein.

* * * * *